United States Patent [19]

Ruger

[11] 4,161,980

[45] Jul. 24, 1979

[54] COOLING CAPSULE FOR THYRISTORS

[75] Inventor: Heribert Rüger, Erlangen, Fed. Rep. of Germany

[73] Assignee: Siemens Aktiengesellschaft, Munich, Fed. Rep. of Germany

[21] Appl. No.: 828,421

[22] Filed: Aug. 29, 1977

[30] Foreign Application Priority Data

Sep. 24, 1976 [DE] Fed. Rep. of Germany ...... 2643072

[51] Int. Cl.² .......................... F28F 7/02; H01L 3/00
[52] U.S. Cl. .................................. 165/168; 165/180; 357/82
[58] Field of Search ............... 165/80, 168, 180, 172, 165/80 C, 80 E; 357/82; 361/385

[56] References Cited

U.S. PATENT DOCUMENTS

| 1,847,573 | 3/1932 | Rupp | 165/180 |
| 2,282,627 | 5/1942 | Weiss | 165/168 |
| 2,504,281 | 4/1950 | Spanne | 165/168 |
| 3,823,771 | 7/1974 | Ludwig | 165/80 |
| 3,848,665 | 11/1974 | Uerlichs et al. | 165/168 |

Primary Examiner—Sheldon Jay Richter
Attorney, Agent, or Firm—Kenyon & Kenyon

[57] ABSTRACT

A cooling capsule for thyristors wherein the capsule comprises a core in which is cast or embedded a cooling coil having the form of a helix which extends from a first end to a region at which it turns around and extends to a second end in the manner of a bifilar winding.

8 Claims, 2 Drawing Figures

… … …

COOLING CAPSULE FOR THYRISTORS

BACKGROUND OF THE INVENTION

1. Field of the Invention

The invention relates to a cooling capsule for thyristors wherein the capsule includes a core of heat-conductive material having first and second end faces for heat conductive connection to thyristors and wherein a cooling coil is embedded in the core to provide a flow path for a liquid coolant therethrough, the cooling coil having first and second ends to provide inlet and outlet openings and having subsections located in the core in respective first and second planes which extend in the vicinity of and approximately parallel to the first and second end faces, respectively, of the core.

2. Detailed Description

A cooling capsule of the above-type for cooling disk-type thyristors is presently commercially available. In the aforesaid cooling capsule, the subsections of the cooling coil arranged in the first and second planes of the core have spiral configurations and are connected together at their ends by a further subsection of the cooling coil, so that a closed flow path exists from the inlet to the outlet opening. More particularly, in this cooling capsule, the coolant flows from the inlet opening, which lies in one of the first and second planes, through the spiral-shaped subsection disposed in this one plane and then through the spiral-shaped subsection lying in other plane and out the outlet opening. Thus, coolant of different temperature flows through the first and second planes and a radial temperature gradient, referred to each spiral, exists in each plane. As a result, not only are the thyristors which are in thermal contact with the first and second end faces of the core of the capsule cooled differently, but also the temperature distribution in each heat transfer plane between the cooling capsule and each thyristor is not constant.

As above-indicated, the aforesaid known cooling capsule is used for cooling a disk-type thyristor, which typically is clamped between two such cooling capsules. The capsules are also used in so-called thyristor columns for cooling several disk-type thyristors wherein the thyristors are stacked one on top of the other and clamped and a cooling capsule is inserted on each side of a disk-type thyristor with its heat transfer surface resting against the thyristor. Such a thyristor column is disclosed, for example, in U.S. Pat. No. 3,603,381.

Particularly in the case of a thyristor column, the above-described different cooling action at the first and second end faces of the known cooling capsule has an adverse effect on the operation of the column and can lead to a condition where the thyristor column can be operated only at a power below its rated power limits, in order to avoid thermal overloading.

It is, therefore, an object of the present invention to realize a cooling capsule of the above-type which is so configured that its first and second end faces are at least approximately at the same temperature when loaded.

SUMMARY OF THE INVENTION

In accordance with the principals of the present invention the above and other objectives are accomplished in a cooling capsule of the above type by forming the cooling coil of the capsule as a helix which extends from a first end to a region where it turns around and extends to a second end in the manner of a bifilar winding, thereby situating subsections of the coil carrying coolant flowing in opposite directions alternatingly adjacent one another, and by forming the subsections of the coil which lie in the first and second planes of the capsule to be at least partially straight. As used herein, what is meant by the term helix is a three-dimensional geometric figure.

In the embodiment of the invention to be disclosed hereinafter, the cooling coil is formed as a bifilarly wound helix, where a bifilarly wound helix is understood to be a double-tube helix comprising first and second helical subsections whose turns lie alternatingly close together and form respective outgoing and return lines for the coolant. With the cooling coil so formed, relatively cold and hot coolant moving in opposite directions flows through the adjacently arranged turns of the coil. The average value of the temperature of the helix is, thus, substantially constant over the entire helix and, hence, over the first and second end faces of the core of the capsule. Uniform cooling of thyristors fastened in a heat-conducting manner to such end faces is, therefore, realizable.

The turning or deflecting of the helical coil is preferably accomplished in a region or subsection of the coil which interconnects the subsections of the cooling coil lying in the first and second planes. As a result, the coil need not be deflected through an angle of approximately 360° and the manufacturing and hydrodynamic difficulties connected therewith are avoided.

The cooling coil of the capsule of the invention is, preferably, made of a corrosion-resistant metal. If coolants with oxidizing action are to be carried by the coil, the coil may preferably be made of stainless steel.

The core of the capsule of the invention can also be formed from a suitable metallic material. Preferably, aluminum or an aluminum alloy can be used, thereby affording the core a high thermal conductivity and low heat resistance.

BRIEF DESCRIPTION OF THE DRAWINGS

The above and other features and aspects of the present invention will become more apparent upon reading the following detailed description in conjunction with the accompanying drawing, in which.

DETAILED DESCRIPTION

Figure 1:
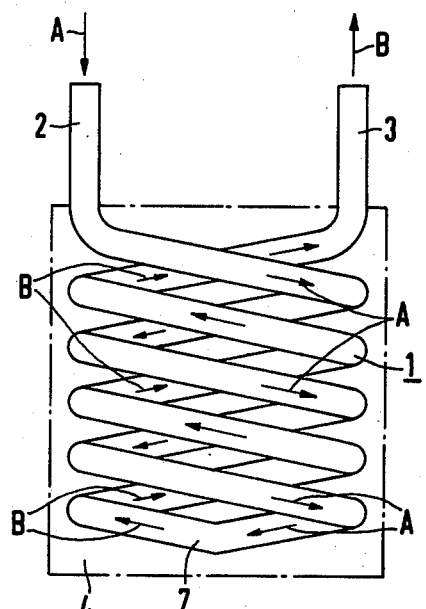
FIG. 1 shows in pictorial fashion a cooling capsule in accordance with the principles of the present invention.

FIG. 1 shows a cooling capsule in accordance with the principles of the present invention. The capsule comprises a helical, bifilarly wound cooling coil 1 having an inlet nozzle 2 and an outlet nozzle 3. The cooling coil 1 is cast or embedded in a core 4 of heat-conductive material, which is indicated in the figure by a dash-dotted line. The core 4 can be made of a heat-conductive plastic material but, preferably, should be made of a metallic material such as, for example, an aluminum or an aluminum alloy. An aluminum-silicon-magnesium alloy has been found to be particularly suitably for this purpose. The cooling coil 1, on the other hand, can, preferably, be made of a corrosion-resistant metal. For example, a stainless steel, such as a chromium-nickel-titanium steel, can be used.

To permit a clearer understanding of the configuration of the helical, bifilarly wound cooling coil 1, the inflow direction of the coolant into and through the coil has been marked in FIG. 1 with the arrows A and the outflow direction of the coolant out of the coil with the arrows B. It can be seen from FIG. 1 that, due to the helical bifilarly wound shape of the coil 1, turns lying close together alternatingly carry coolant flowing in opposite directions, i.e., in the arrow directions A and B. Thus, relatively hotter and colder coolant flows alternatingly through adjacent coil turns, whereby at least an approximately constant average temperature is obtained over the entire helical coil.

Figure 2:
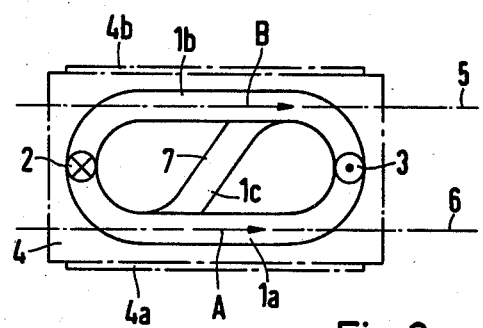
FIG. 2 shows a top view of the cooling capsule of FIG. 1.

The top view onto the capsule of FIG. 1 illustrated in FIG. 2 shows that the coil 1 is arranged in the core 4 so that it has subsections 1a and 1b situated in first and second planes 5 and 6 within the core. These planes are arranged in proximity of and approximately parallel to the end faces 4a and 4b, respectively, of the core, the latter end faces being provided for the heat-conducting connection to a thyristor. As shown, the subsections 1a and 1b of the coil are of substantially straight configuration, so that a uniform cooling of the end faces 4a and 4b of the core 4 is obtained. This cooling is of about the same magnitude for both end faces so that no temperature gradient occurs therebetween. As can be further seen, due to the straight path followed by the subsections 1a and 1b, the helical cooling coil 1 assumes a flattened shape in the vicinity of the planes 5 and 6.

As can be appreciated from FIGS. 1 and 2, the embodiment of the invention shown therein also avoids the necessity of having to turn the cooling coil 1 by approximately 360° to realize the bifilar configuration. Such a sharp turn or deflection could lead to manufacturing as well as hydrodynamic difficulties. More specifically, as can be seen in FIGS. 1 and 2, the deflection point 7 of the coil 1 is located in a region or subsection 1c of the coil which interconnects the subsections 1a and 1b which lie in the planes 5 and 6. As a result, a substantially smaller curvature at the deflection point 7 can be realized and the above-mentioned manufacturing and hydrodynamic difficulties are thereby avoided.

What is claimed is:

1. In a cooling capsule for use with thyristors wherein the capsule includes a core having first and second end faces adapted for heat-conducting connection to a thyristor and wherein a cooling coil is cast within said core for providing a flow path for liquid coolant therethrough, said cooling coil having first and second ends extending from said core to provide inlet and outlet openings and having subsections which are located in said core in respective spaced first and second planes which extend in the vicinity of and approximately parallel to said first and second end faces of said core, respectively, the improvement comprising:

said cooling coil being formed as a helix which extends from said first end to a region at which it turns around and extends to said second end in the manner of a bifilar winding, said subsections which carry coolant in opposite directions being alternatingly arranged adjacent one another; and subsections of said helix being arranged to lie in said first and second planes and being formed so as to be at least partially straight.

2. In a cooling capsule in accordance with claim 1, the improvement wherein:

said helix is formed of a first helix section included in the portion of said helix extending between said first end and said region and a second helix section included in the portion of said helix extending between said region and said second end, said first helix section turning in a first direction and said second helix section turning in a second direction opposite to said first direction.

3. In a cooling capsule in accordance with claim 2, the improvement wherein:

a portion of each turn of said second helix section lies between portions of successive turns of said first helix section.

4. In a cooling capsule in accordance with claim 1, the improvement wherein:

said region interconnects said subsections of said helix which lie in said first and second planes.

5. In a cooling capsule in accordance with claim 1, the improvement wherein:

said cooling coil comprises a corrosion-resistant metal.

6. In a cooling capsule in accordance with claim 1, the improvement wherein:

said cooling coil comprises stainless steel.

7. In a cooling capsule in accordance with claim 1, the improvement wherein:

said core comprises a metallic material.

8. In a cooling capsule in accordance with claim 7, the improvement wherein:

said metallic material is one of aluminum and an aluminum alloy.

* * * * *